(12) United States Patent
Chang et al.

(10) Patent No.: US 9,735,087 B2
(45) Date of Patent: Aug. 15, 2017

(54) WAFER LEVEL EMBEDDED HEAT SPREADER

(71) Applicant: Taiwan Semiconductor Manufacturing Company, Ltd., Hsin-Chu (TW)

(72) Inventors: Wei Sen Chang, Jinsha Township (TW); Tsung-Hsien Chiang, Hsin-Chu (TW); Yen-Chang Hu, Tai-Chung (TW); Ching-Wen Hsiao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/623,474

(22) Filed: Sep. 20, 2012

(65) Prior Publication Data

US 2014/0077394 A1    Mar. 20, 2014

(51) Int. Cl.
*H01L 21/50* (2006.01)
*H01L 23/48* (2006.01)
*H01L 23/433* (2006.01)
*H01L 23/538* (2006.01)
*H01L 23/498* (2006.01)
(Continued)

(52) U.S. Cl.
CPC .... *H01L 23/4334* (2013.01); *H01L 23/49827* (2013.01); *H01L 23/5389* (2013.01); *H01L 24/73* (2013.01); *H01L 21/568* (2013.01); *H01L 23/49816* (2013.01); *H01L 24/16* (2013.01); *H01L 24/20* (2013.01); *H01L 24/83* (2013.01); *H01L 2224/12105* (2013.01); *H01L 2224/29139* (2013.01); *H01L 2224/32245* (2013.01); *H01L 2224/73267* (2013.01); *H01L 2224/83005* (2013.01); *H01L 2224/92244* (2013.01); *H01L 2924/181* (2013.01)

(58) Field of Classification Search
CPC . H01L 2924/01029; H01L 2924/01013; H01L 2924/01079; H01L 2924/14; H01L 24/83; H01L 23/49827; H01L 23/5389; H01L 24/73; H01L 24/16; H01L 24/20
USPC .......................................................... 257/782
See application file for complete search history.

(56) References Cited

U.S. PATENT DOCUMENTS 6,282,095 B1 *  8/2001  Houghton et al. ............ 361/704
7,247,523 B1 *  7/2007  Huemoeller ........ H01L 21/6835
                                              257/E23.178

(Continued)

*Primary Examiner* — Marc Armand
*Assistant Examiner* — Long H Le
(74) *Attorney, Agent, or Firm* — Slater Matsil, LLP (57) ABSTRACT

Disclosed herein are a device having an embedded heat spreader and method for forming the same. A carrier substrate may comprise a carrier, an adhesive layer, a base film layer, and a seed layer. A patterned mask is formed with a heat spreader opening and via openings. Vias and a heat spreader may be formed in the pattern mask openings at the same time using a plating process and a die attached to the head spreader by a die attachment layer. A molding compound is applied over the die and heat spreader so that the heat spreader is disposed at the second side of the molded substrate. A first RDL may have a plurality of mounting pads and a plurality of conductive lines is formed on the molded substrate, the mounting pads may have a bond pitch greater than the bond pitch of the die contact pads.

20 Claims, 6 Drawing Sheets

(51) Int. Cl.
*H01L 21/56* (2006.01)
*H01L 23/00* (2006.01)

(56) References Cited

U.S. PATENT DOCUMENTS

| | | | | |
|---|---|---|---|---|
| 7,411,297 | B2* | 8/2008 | Luo | ................... H01L 21/561 |
| | | | | 257/738 |
| 2006/0175692 | A1* | 8/2006 | Hsu | ................. H01L 23/49816 |
| | | | | 257/679 |
| 2006/0186536 | A1* | 8/2006 | Hsu | ..................... H01L 23/36 |
| | | | | 257/720 |
| 2008/0157344 | A1* | 7/2008 | Chen | ................ H01L 23/3121 |
| | | | | 257/706 |
| 2008/0237828 | A1* | 10/2008 | Yang | ................ H01L 21/6835 |
| | | | | 257/690 |
| 2009/0032933 | A1* | 2/2009 | Tracht | .............. H01L 21/6835 |
| | | | | 257/693 |
| 2011/0291249 | A1 | 12/2011 | Chi et al. | |
| 2013/0056871 | A1* | 3/2013 | Yu | .................... H01L 23/3114 |
| | | | | 257/738 |

* cited by examiner

WAFER LEVEL EMBEDDED HEAT SPREADER

BACKGROUND

Generally, one of the driving factors in the design of modern electronics is the amount of computing power and storage that can be shoehorned into a given space. The well-known Moore's law states that the number of transistors on a given device will roughly double every eighteen months. In order to compress more processing power into ever smaller packages, transistor sizes have been reduced to the point where the ability to further shrink transistor sizes has been limited by the physical properties of the materials and processes. Furthermore, the use of more powerful processors in ever-shrinking package form factors leads to a thermal management issue. Increased device operating speeds, along with a greater transistor count on individual components, create heat in amounts that may damage or reduce the efficiency of the components. Furthermore, tighter package integration and more compact device bring more heat generating devices into smaller areas, concentrating the heat generated.

BRIEF DESCRIPTION OF THE DRAWINGS

For a more complete understanding of the present embodiments, and the techniques involved in making and using the same, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale. For clarity non-essential reference numbers are left out of individual figures where possible.

DETAILED DESCRIPTION OF ILLUSTRATIVE EMBODIMENTS

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely making and using embedded heat spreaders useful in, for example, wafer level processor assemblies. Other embodiments may also be applied, however, to other electrical components, including, but not limited to, memory assemblies, displays, input assemblies, discrete components, power supplies or regulators or any other embedded components.

The presented disclosure is directed to providing a system and method for creating an embedded heat spreader for an active device, embedded processor, die, chip, discrete component or the like. An embedded heat spreader may permit a heat generating component to dissipate heat or transfer heat from the component, reducing the heat load on the component, particularly under prolonged use. Providing a heat spreader for an embedded die may permit greater die reliability and longer die life.

Figure 1:
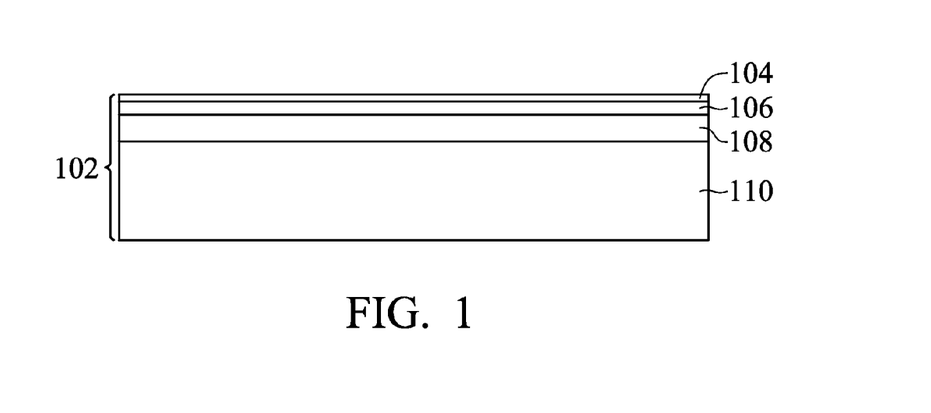
FIGS. 1-7 are cross-sectional diagrams illustrating intermediate steps in an embodiment of a method for forming an embedded heat spreader.

Referring to FIG. 1, a cross-section of an embodiment of an intermediate step for forming a wafer level embedded heat spreader is depicted. A carrier substrate 102 may comprise a carrier 110 that may be configured to provide structural rigidity or a base for deposition of subsequent non-rigid layers. In one embodiment, the carrier 110 may be a glass carrier, but may alternatively be a wafer, semiconductor, metal, synthetic or other material having a suitable topography and structural rigidity.

A glue or adhesive layer 108 may, in some embodiments, be applied to the carrier 110, with an optional base film layer 106 and optional seed layer 104 applied over the adhesive layer 108. In one embodiment, the adhesive layer 108 may be adhesive tape, or alternatively, may be a glue or epoxy applied to the carrier 110 via a spin-on process, or the like. In some embodiments, the adhesive layer 108 may be used to separate the carrier 110 from the heat spreader assembly and associated devices or layers in subsequent steps.

The seed layer 104 may be formed over the adhesive layer 108 and may act as a base for subsequent metal plating or deposition steps. In some embodiments, the seed layer 104 may be used as an electrode in a subsequent electroplating process. The seed layer 104 may be deposited via physical vapor deposition (PVD), chemical vapor deposition (CVD), including, but not limited to Plasma enhanced CVD (PECVD), low pressure CVD (LPCVD), Atomic layer CVD, via atomic layer deposition, sputtering, electrochemical deposition, or another suitable method. In some embodiments, the seed layer 104 may be copper, and in other embodiments, the seed layer may be gold, aluminum tantalum, nickel, alloys of the same, or another material or alloy.

The base film layer 106 may, in some embodiments, be applied and formed of a material that advantageously permits later layers to properly form. For example, in one non-limiting embodiment, the base film layer 106 may be formed of a polymer such as polybenzoxazole (PBO). In such an embodiment, the PBO may be applied to the adhesive layer 108, where used, or optionally, applied directly to the carrier 110 via spin coating, or the like. A curable polymer such as PBO permits application of the base film layer 106 through a spin coating process, but is still capable of forming a substantially firm base film through curing. Additionally, PBO may be advantageous because the flexible structure created after curing acts as a buffer between materials with different coefficients of expansion (CoE). For example, in one embodiment, the carrier 110 may be glass, and have a CoE much lower than a seed layer 104 made, from, for example, copper. In such an embodiment, a semi-rigid base film layer 106 may act to buffer the different expansions curing thermal processing. However, any suitable material may be used as the base film layer 106.

Figure 2:
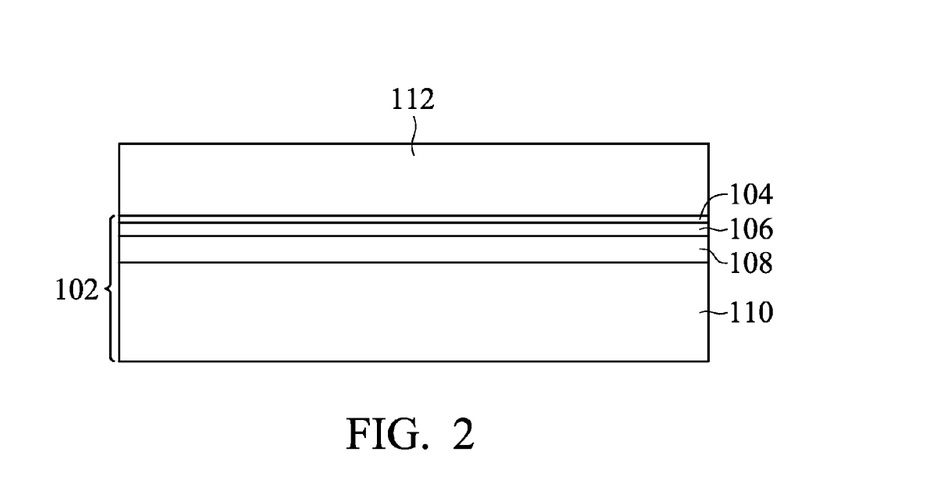

FIG. 2 depicts a cross-sectional view of an embodiment of an intermediate step for forming a wafer level embedded heat spreader. A mask layer 112 may be applied over the seed layer 104. In some embodiments, the mask layer 112 may be a photoresist applied via a spin-on process. In other embodiments, the mask layer 112 may be a hard mask such as a nitride, oxide, oxynitride or the like. A mask layer 112 that is a hard mask may be applied by PVD, CVD, or via another suitable deposition method.

Figure 3:
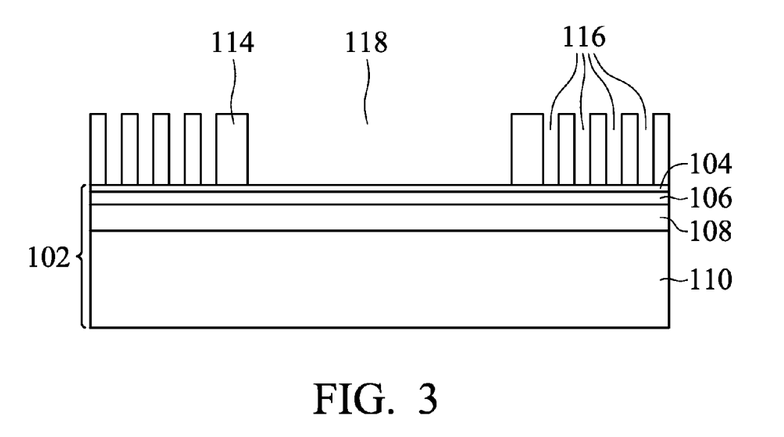

FIG. 3 depicts a cross-sectional view of an embodiment of an intermediate step for forming a wafer level embedded heat spreader using a patterned mask 114. The mask layer 112 is patterned and developed to form the patterned mask 114. The mask layer 112 may be patterned to form patterned mask 114 having a heat spreader opening 118 and optionally, one or more via openings 116. In one embodiment, the patterned mask may be formed so that the structures created in the via openings 116 may be initially formed to a height of about 105 µm, then subsequently ground, polished, etched, or otherwise reduced to height of about 80 µm to about 90 µm. In some embodiments, the via openings 116 in the patterned mask 114 may have a pitch of around 110 µm and diameter of about 70 µm. Thus the structures formed in the via openings 116 will have a resulting height-to-width ratio of 1.5:1 after formation.

Figure 4:
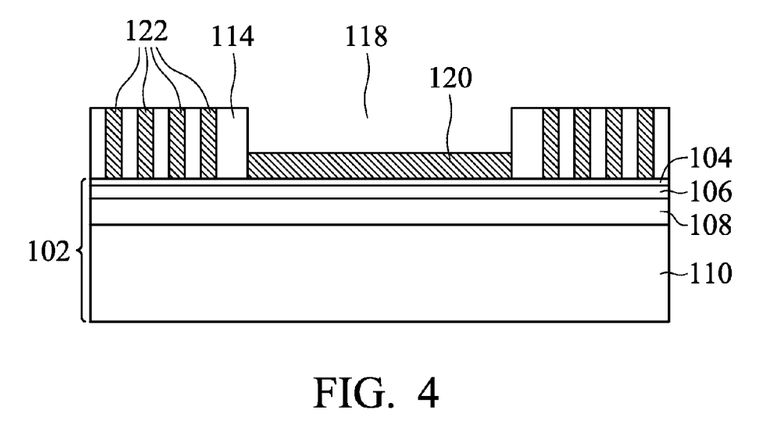

FIG. 4 depicts a cross-sectional view of formation of the heat spreader 120 according to some embodiments of the disclosure. In one embodiment, the heat spreader 120 may be deposited via a plating process such as a through-aperture-via (TAV) plating process. In some embodiments, the heat spreader 120 may be formed in the same step as one or more vias 122. For example, one non-limiting embodiment may be where copper is plated on the seed layer 104 to fill the via openings 116 and the lower portion of the heat spreader opening 118 to form the vias 122 and heat spreader 120, respectively. This may be accomplished, for example, by a copper electroplating process where the carrier substrate 102 with the patterned mask 114 applied is submerged in a copper solution with a current applied, resulting in buildup of copper on the seed layer 104. Alternatively, an electroless plating process, CVD, PECVD or another metal deposition process may be employed to form the heat spreader 120 and vias 122. The thickness of the heat spreader 120 may depend on the area of the heat spreader 120 and the number of vias 122. For example, in some embodiments, there may be 1200 vias 122, and the heat spreader 120 may be formed to a thickness between about 3 µm and about 5 µm.

While the process for forming the heat spreader 120 and via 122 may take place using a plating process and at the same time, in another embodiment, forming the heat spreader 120 and any vias 122 may be performed in multiple steps. For example, the vias 122 may be formed in a first plating step, and then the heat spreader 120 formed or placed in a subsequent step. In such an embodiment, the patterned mask 114 may be formed without the heat spreader opening 118, but with the via openings 116. The vias 122 may be formed in the via openings 116, and the heat spreader opening 118 may be formed after the vias 122 are formed. The heat spreader 120 may then be formed in the heat spreader opening 118 after the vias 122 are already formed. In such an embodiment, the vias 122 may be masked or covered during the formation of the heat spreader 120. A multi-step metal deposition procedure may permit application of different materials for the vias 122 and heat spreader 120. For example, a copper heat spreader 120 may be formed after vias 122 formed from, for example, gold, are created.

The embedded heat spreader 120 may also, in another embodiment, be formed separately, and then applied to the carrier substrate 102. In such an embodiment, the heat spreader 120 may, for example, be milled, molded or otherwise formed away from the carrier substrate 102, and then applied to the adhesive layer 108, the base film layer 106, or the seed layer 104. In such an embodiment, the seed layer 104, which may not be required or advantageous since the heat spreader 120 is being placed instead of formed in situ, may be eliminated, and the heat spreader 120 applied to the base film layer 106, adhesive layer 108, or to the carrier 110 directly.

Figure 5:
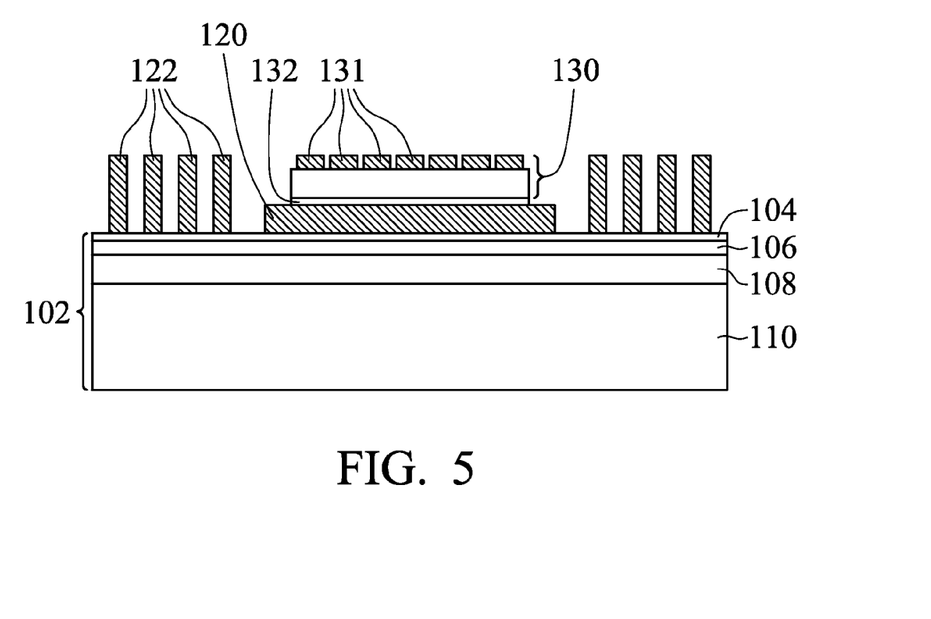

FIG. 5 depicts a cross-sectional view of application of an active device such as a die 130 to the heat spreader 120 according to some embodiments of the disclosure. The patterned mask 114 is removed after formation of the vias 122 and heat spreader 120. For example, in embodiments where the mask layer 112 was formed by a photoresist, the resulting patterned mask 114 may be removed via ashing and an optional rinse or cleaning. In embodiments where the mask layer 112 was formed by a hard mask, the resulting patterned mask 114 may be removed by etching the pattern mask to leave the underlying carrier substrate 102.

A die 130 is applied to the heat spreader using a die attachment layer 132 such as a die attachment film (DAF) or the like. In some embodiments, the die attachment layer 132 may have thermal characteristics sufficient to bring the die 130 into thermal contact with the heat spreader 120. In some embodiments, the die attachment layer 132 may be a thermal compound having, for example, a silver content sufficient to transfer an amount of heat from the die 130 to the heat spreader 120 to permit the die 130 to operate while generating a predetermined heat output. Thus, the die attachment layer 132 may transmit sufficient heat energy from the die 130 to the heat spreader 120, lowering or maintaining the temperature of the die 130 when the die is operating within a predetermined range. Such temperature management may permit the die 130 to operate at a higher speed or capacity for longer periods of time while maintaining the integrity of the die 130 components.

In some embodiments, the die 130 may be attached to the heat spreader 120 by attaching the top, or non-contact, side of the die 130 to the heat spreader 120 by the die attachment layer 132. Thus, the die 130 may be placed so that a first side of the die 130 having one or more contact pads 131 or mounting pads of the die 130 is opposite a second side of the die 130 that is mounted to the heat spreader 120.

Figure 6:
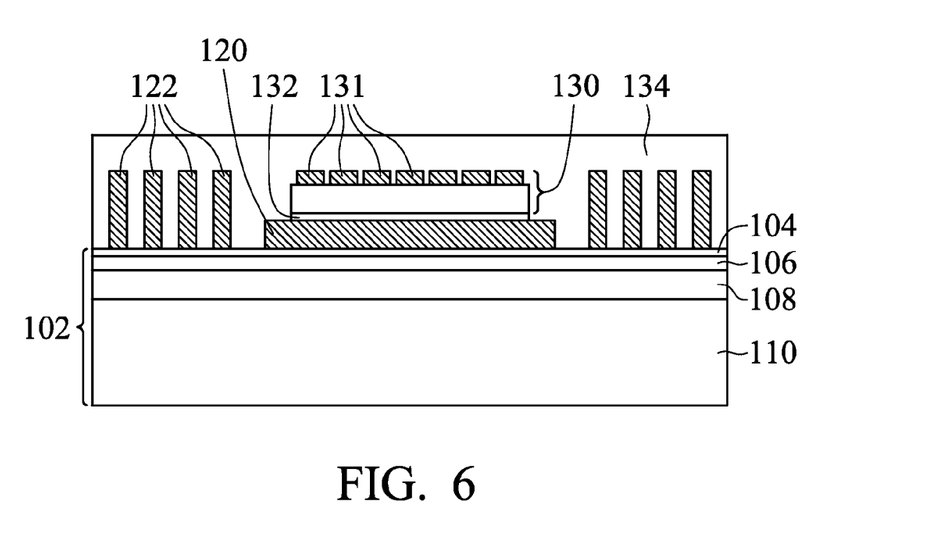

FIG. 6 depicts a cross-sectional view of application of a molding compound 134 to embed the heat spreader 120. The molding compound 134 may be a flowable compound having a high dielectric constant. In some embodiments, a mold or other enclosure for retaining the moldable compound may be used to form the molding compound 134. In such an embodiment, an epoxy or similarly liquid molding compound 134 may be effectively used to form the molded substrate 800. Additionally the molding compound 134 may be cured after application. For example, the molding compound 134 may be an epoxy that uses a catalyst, and cures after application. Alternatively, the molding compound 134 may be cured through application of a catalyst after application, for example, curing a molding compound via ultraviolet exposure, or through exposure to air, or the like.

Figure 7:
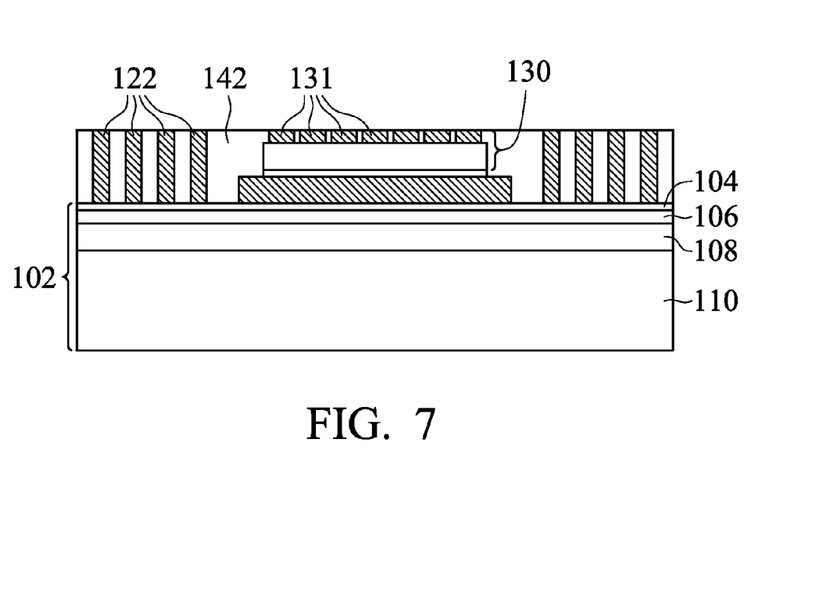

FIG. 7 illustrates a polished or reduced molding compound 142 according to some embodiments of the disclosure. The molding compound 134 may undergo a grinding step to remove excess material from the die 130 contact pads 131 and vias 122. In such an embodiment, the molding compound 134 may be subjected to a chemical-mechanical polish, a purely mechanical polish, chemical etching, or another suitable reduction process. The resulting reduced molding compound 142 may, in some embodiments, have a top surface at or below the top surfaces of the vias 122 and the die 130 contact pads 131. Thus, the vias 122 and die 130 contact pads 131 may be exposed at the polished side of the reduced molding compound 142 such that electrical contacts may be formed on the vias 122 and die 130 contact pads 131. In some embodiments, the grinding may also reduce the height of the vias 122 to about 80 μm to about 90 μm, resulting in a height-to-width ratio between about 1.1:1 and about 1.3:1.

Figure 8:
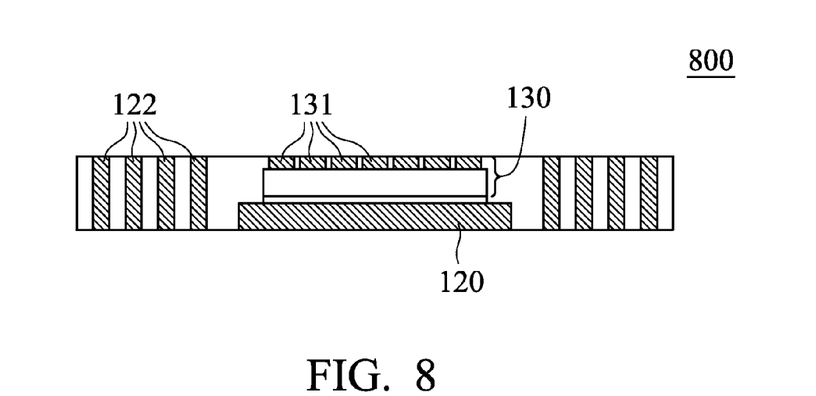
FIG. 8 is a cross-sectional diagram illustrating a molded substrate with heat spreader assembly.

FIG. 8 illustrates a molded substrate 800 after debonding from the carrier substrate 102. The carrier 110 may be separated from the molded substrate 800 at the adhesive layer 108, and any remaining adhesive layer 108 material, and any base film layer 106 or seed layer 104 material may be removed by, for example, etching, polishing or the like. The resulting molded substrate 800 may have the die 130 contact pads 131 exposed on a first side and the heat spreader 120 disposed, and exposed, at a second, opposite side.

Figure 9:
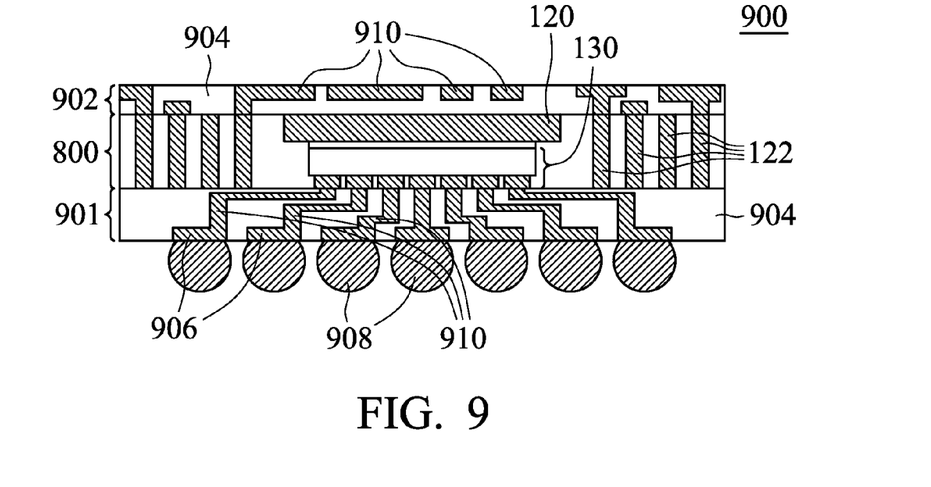
FIGS. 9-10 are cross sectional diagrams of embodiments of a wafer level device with embedded heat spreader.

FIG. 9 depicts a wafer level assembly 900 having an embedded heat spreader 120 according to an embodiment of the disclosure. The molded substrate 800 may have a first redistribution layer (RDL) 901 disposed on one side and one or more second RDLs 902 disposed on an opposite side. The first RDL 901 may, in some embodiments, have one or more conductive lines 910 disposed in an intermetal dielectric (IMD) 904, and in electrical contact with contact pads 131 on the die 130. The conductive lines 910 may be arranged to provide an electrical connection between contact pads 131 on the die 130 and RDL contact pads 906. The conductive lines 910 may fan out from the die 130 contact pads 131 such that the RDL contact pads 906 may have a larger bond pitch than the die 130 contact pads 131, and which may be suitable for a ball grid array 908 or other package mounting system. While the first RDL 901 is illustrated having conductive lines 910 configured to fan out and provide an electrical connection between the die 130 contact pads 131 and RDL contact pads 906, the first RDL 901 is not limited to such embodiments. In some embodiments, the first RDL 901 may also have conductive lines 910 that connect one or more vias 122 to the RDL contact pads 906. In yet another embodiment, the conductive lines 910 may electrically connect, for example, a via 122 to another via 122, to a die 130 contact pad, or to another die or device disposed in the molded substrate 800.

Additionally, an embodiment of a heat spreader 120 formed larger than the die 130 is shown. In some embodiments, the heat spreader 120 may be substantially the same size or footprint as the die 130, resulting in a reduced area required to form the heat spreader 120. The heat spreader 120 may be substantially larger than the die 130 to provide a greater heat dissipation or absorption capacity. The heat spreader 120 may be formed as large as allowed by the requirements of via 122 placement and boundaries of the molded substrate 800.

Similarly, the second RDL 902 disposed on the opposite side of the molded substrate 800 from the first RDL 901 may have one or more conductive lines 910 disposed in an IMD 904 or other dielectric material. The second RDL 902 conductive lines 910 may interconnect the vias 122, or may connect the vias to one or more other devices or elements disposed in, or outside of, the wafer level assembly 900.

In some embodiments, the second RDL 902 may be disposed over the heat spreader 120, and the region over the heat spreader 120 may include conductive lines 910. Thus, the second RDL 902 may be disposed over a portion of the heat spreader 120, and a portion of a conductive line 910 may also be disposed over the heat spreader 120. Such an embodiment may be employed where components or vias 122 that are disposed on opposite sides of the heat spreader 120 are connected to each other.

Thus, a wafer level assembly 900 having an embedded heat spreader 120 may, in some embodiments, be a device comprising a substrate 800, a die 130 disposed in the substrate and having contact pads 131 disposed on a first side of the die 130 and exposed through a first side of the substrate 800 and where a heat spreader 120 may further be in thermal contact with the die 130 and disposed at a second side of the substrate 800. Additionally, the heat spreader 120 may be disposed at a second side of the die 130 and configured to transfer heat from the die 130. In some embodiments, at least one via 122 may be disposed in the substrate 800 and extending from the first side of the substrate 800 to the second side of the substrate 800.

In some embodiments, a first RDL 901 may be disposed on the first side of the substrate 800, and may have at a plurality of RDL contact pads 906 and at least one conductive line 910 electrically connecting contact pads 131 on the die 130 to the RDL contact pads 906. Furthermore, the RDL contact pads 906 may have a bond pitch greater than the bond pitch of the contact pads 131. A second RDL 902 may also be disposed on the substrate 800 opposite the first RDL 901, and may have conductive lines in contact with the vias 122. The second RDL 902 is disposed on and may cover the heat spreader 120. Additionally, a portion of at least one conductive line 910 may be disposed over the heat spreader 120. In some embodiments, a die attachment layer 132 disposed between, and in contact with, the second side of the die 130 and the heat spreader 120. The die attachment layer 132 may optionally be a die attachment film, and may bond the heat spreader 120 and the die 130.

Figure 10:
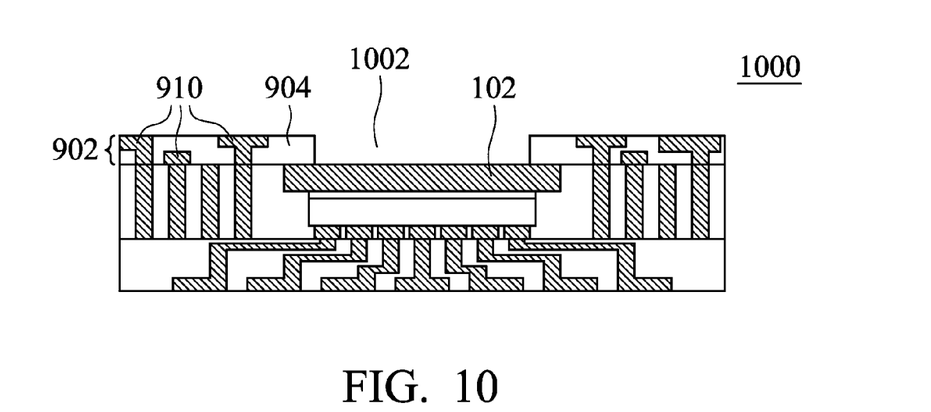

FIG. 10 depicts a wafer level assembly 1000 having an embedded heat spreader 120 according to another embodiment of the disclosure. In some embodiments, the second RDL 902 may be formed to have a heat exposure opening 1002. This may permit greater airflow over the heat spreader 120, resulting in more efficient heat radiation, and permitting the heat spreader 120 to shed excess heat into the surrounding or outside environment. In such embodiments, the conductive lines 910 in the second RDL 902 may be routed around the heat exposure opening 1002. In some embodiments, the heat exposure opening 1002 may be formed during IMD 904 creation by, for example, masking the heat exposure opening 1002. In other embodiments, the heat exposure opening 1002 may be etched or otherwise created over the heat spreader 120 after the IMD 904 is created.

In some embodiments, the second RDL 902 may cover only a portion of the heat spreader 120. In other embodiments, the second RDL 902 may completely avoid the surface of the heat spreader 120 to expose an entire surface of the heat spreader 120. Thus, a heat spreader 120 larger than the die 130 may be formed, with a portion of the second RDL 902 covering only a portion of the heat spreader 120, and with a portion of the heat spreader 120 exposed. In such an embodiment, one or more conductive lines 910 may be routed through the second RDL 902 over the heat spreader 120, allowing the heat spreader 120 to be formed without interfering with the layout of the second RDL 902 conductive lines 910.

Figure 11:
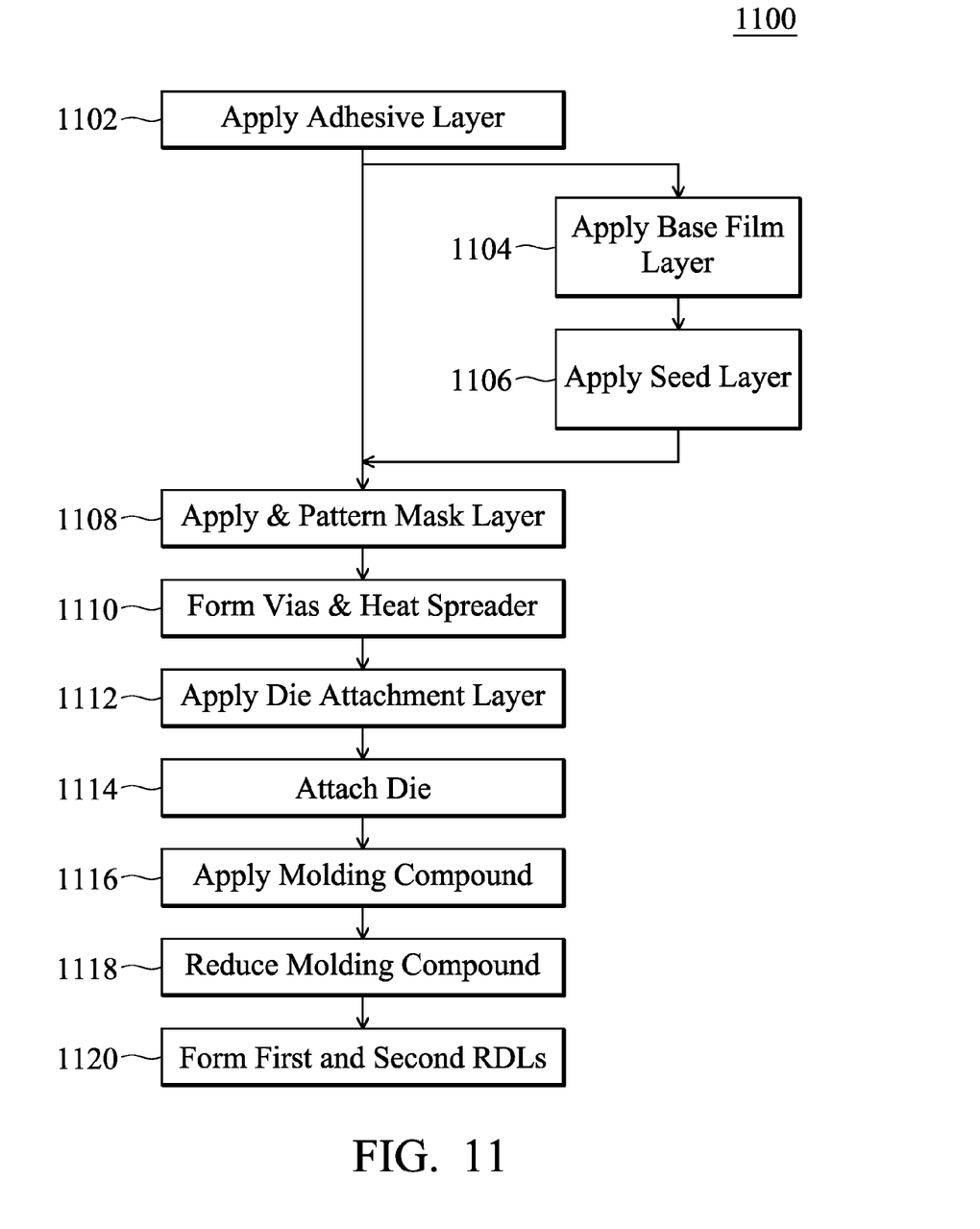
FIG. 11 is a flow chart illustrating a method for forming a wafer level assembly having an embedded heat spreader.

FIG. 11 is a flow chart illustrating a method 1100 for forming a wafer level assembly 900 having an embedded heat spreader 120. A carrier substrate 102 may be formed by providing a carrier 110 and applying an adhesive layer 108 on the carrier 110 in block 1102. A base film layer 106 may optionally be applied on the adhesive layer 108 in block 1104. A seed layer 104 may optionally be applied on the base film layer 106 in block 1106. A patterned mask 114 having a heat spreader opening 118 may be formed on the carrier substrate 102 in block 1108 by applying and patterning the mask layer 112. A heat spreader 120 and vias 122 may be formed in the patterned mask 114 in block 1110. A die attachment layer 132, which may optionally be a die attachment film, may be applied on the heat spreader 120 in block 1112. A die 130 having a plurality of contact pads 131 disposed on a second side of the die 130 may be mounted via a first side on the die attachment layer 132 in block 1114. A molding compound 142 may be applied over the die 130 and heat spreader 120 to create a molded substrate 800 in block 1116 so that the contact pads 131 of the die 130 are exposed at the first side of the molded substrate 800, and so that the heat spreader 120 is disposed at the second side of the molded substrate 800. The carrier 110 may be subsequently debonded from the device 900. The vias 122 and the heat spreader 120 may be formed at the same time using a plating process or another suitable metal deposition process.

In some embodiments, the wafer level assembly 900 creation method 1100 may further comprise forming a first RDL 901 on the first side of the molded substrate 800 in block 1120. The first RDL 901 may have a plurality of RDL contact pads 906 and a plurality of conductive lines 910, each conductive line 910 providing an electrical connection between a mounting pad 906 and a contact pad of the die 130. In additional embodiments, the RDL contact pads 906 may have a bond pitch greater than the bond pitch of the die 130 contact pads 131. A second RDL 902 may also be formed on the second side of the molded substrate 800 in block 1120 and may cover at least a portion of the heat spreader 120 and have at least one conductive line 910 in electrical contact with at least one via 122.

Although the present embodiments and their advantages have been described in detail, it should be understood that various changes, substitutions and alterations can be made herein without departing from the spirit and scope of the disclosure as defined by the appended claims. It will be readily understood by those skilled in the art that many of the features and functions discussed above can be implemented using a variety of materials and orders to the processing steps. For example, heat spreaders 120 may be virtually any shape, for example, to avoid vias or conform to the boundaries of the molded substrate 800. Heat spreader 120 may also be any heat conductive material, such as ceramic or pother non-metallic material, where such material is called for. As another example, it will be readily understood by those skilled in the art that many of the steps for creating a wafer level embedded heat spreader structure may be performed in any advantageous order while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, apparatuses, manufacture, compositions of matter, means, methods, or steps.

What is claimed is:

1. A device comprising:
a die disposed within a substrate at a first side of the substrate, and having a plurality of contact pads disposed on a first side of the die and exposed at the first side of the substrate, the contact pads being level with the first side of the substrate;
a heat spreader disposed within the substrate at a second side of the substrate opposite the first side of the substrate, the heat spreader over and in thermal contact with the die;
a first redistribution layer (RDL) disposed on the first side of the substrate, the first RDL comprising one or more dielectric layers, the first RDL having a plurality of conductive lines disposed in the one or more dielectric layers, a first surface of a first conductive line of the plurality of conductive lines exposed at a first side of the RDL and substantially planar with a surface of a first dielectric layer of the one or more dielectric layers, the first surface of the first conductive line contacting one of the plurality of contact pads on the die, wherein the substrate and the heat spreader are formed of different materials;
a second RDL disposed on the second side of the substrate, the second RDL having a plurality of conductive lines disposed in one or more dielectric layers, wherein the heat spreader is interposed between the second RDL and the die;
an opening in the second RDL, wherein the opening exposes a portion of a surface of the heat spreader, and an uppermost surface of the heat spreader is below an uppermost surface of the second RDL; and
vias electrically interposed between the first RDL and the second RDL.

2. The device of claim 1, wherein the first RDL has a plurality of RDL contact pads disposed at a second side of the first RDL opposite the first side, and at least one conductive line electrically connecting one of the plurality of contact pads on the die to at least one of the plurality of RDL contact pads; and
wherein the RDL contact pads have a bond pitch greater than a bond pitch of the plurality of contact pads disposed on the die.

3. The device of claim 1, wherein the second RDL extends from outside a first edge of the heat spreader, over the heat spreader and past a second edge of the heat spreader opposite the first edge.

4. The device of claim 1, wherein a portion of at least one conductive line of the second RDL is disposed over the heat spreader.

5. The device of claim 1, wherein the second RDL is disposed at a portion of the heat spreader.

6. The device of claim 1, further comprising a die attachment layer disposed between and in contact with a second side of the die and the heat spreader.

7. The device of claim 1, wherein the second RDL completely covers the heat spreader.

8. The device of claim 1, wherein the second RDL overlaps only a portion of the heat spreader.

9. A device comprising:
a die disposed within a substrate and having a plurality of contact pads disposed on a first side of the die, the contact pads having a surface substantially planar with a first side of the substrate, wherein the substrate contacts a portion of the first side of the die, and the substrate comprises a molding compound;

a die attachment layer disposed adjacent to a second side of the die;

a heat spreader embedded within the substrate and having a first side disposed on the die attachment layer, the heat spreader having a second side opposite the first side, a surface of the second side of the heat spreader being substantially planar with a second side of the substrate, the heat spreader being structurally separate from the substrate;

a first redistribution layer (RDL) comprising first insulating layers and a plurality of first conductive lines in the first insulating layers, the first RDL having a substantially planar first side in contact with the contact pads of the die;

a second RDL having second insulating layers and a second plurality of conductive lines in the second insulating layers, the second RDL having a substantially planar first side in contact with the heat spreader and the second side of the substrate, the second side of the substrate being opposite the first side of the substrate; and an opening in the second RDL, wherein the opening exposes a portion of an uppermost surface of the heat spreader, and the heat spreader is interposed between the second RDL and the die.

10. The device of claim 9, wherein the first RDL is further disposed on the first side of the substrate, the substrate contacting at least a portion of the first side of the die between two of the contact pads on the die.

11. The device of claim 9, further comprising:

a plurality of RDL contact pads disposed within the first RDL and at the second side of the RDL opposite the first side; and at least one conductive line disposed within the first RDL and electrically connecting a contact pad on the first side of the die to at least one of the plurality of RDL contact pads, wherein the RDL contact pads have a bond pitch greater than the bond pitch of the contact pads on the first side of the die.

12. A device comprising:

a die embedded within a substrate and having portions of each of at least two sides in contact with the substrate, the die having a plurality of contact pads on a first side of the die, the plurality of contact pads being level with a first side of the substrate; and a die attachment layer disposed adjacent to a second side of the die;

a heat spreader embedded within the substrate, a first side of the heat spreader exposed at a second side of the substrate opposite the first side of the substrate, the first side of the heat spreader being level with the second side of the substrate, the heat spreader having a second side in thermal contact with the die, the second side of the heat spreader opposite the first side, wherein the heat spreader is distinct from the substrate;

a first RDL having a portion of a first side contacting the contact pads of the die;

a second RDL at the second side of the substrate;

an opening in the second RDL, wherein the opening exposes a portion of an uppermost surface of the heat spreader, and the uppermost surface of the heat spreader is below the second RDL; and one or more vias disposed in the substrate and extending from the first RDL to the second side of the substrate, each of the one or more vias laterally spaced apart from the die, each of the one or more vias having a first end substantially level with the first side of the substrate and a second end substantially level with the first side of the heat spreader and the second side of the substrate.

13. The device of claim 12, wherein the first RDL has a plurality of RDL contact pads disposed at a second side of the first RDL opposite the first side, and wherein the first RDL further has at least one first conductive line electrically connecting a contact pad on the die to at least one of the plurality of RDL contact pads.

14. The device of claim 13, wherein the RDL contact pads have a bond pitch greater than the bond pitch of the plurality of contact pads disposed on the die.

15. The device of claim 13, further comprising the second RDL having at least one second conductive line.

16. The device of claim 15, wherein second conductive lines of the second RDL are routed around the opening.

17. The device of claim 15, wherein the one or more vias extend from, and electrically connect the first RDL to the second RDL.

18. The device of claim 17, wherein the first RDL further has at least one third conductive line electrically connecting one of the plurality of RDL contact pads to one of the one or more vias.

19. The device of claim 18, further comprising one or more package connecting structures each disposed on respective ones of the plurality of RDL contact pads.

20. The device of claim 12, wherein the substrate comprises molding compound.

* * * * *